United States Patent [19]

Green et al.

[11] Patent Number: 5,512,375
[45] Date of Patent: Apr. 30, 1996

[54] PSEUDOMORPHIC SUBSTRATES

[75] Inventors: Roger T. Green, Santa Clara County; Gary A. Davis, Alameda County; Verle W. Aebi, San Mateo County, all of Calif.

[73] Assignee: Intevac, Inc., Santa Clara, Calif.

[21] Appl. No.: 138,454

[22] Filed: Oct. 14, 1993

[51] Int. Cl.$^6$ .............................. B32B 17/06; C30B 29/40
[52] U.S. Cl. .................... 428/426; 428/428; 428/432; 428/697; 428/699; 428/700; 428/702; 117/90; 117/95; 117/101; 117/106
[58] Field of Search .................................. 257/190, 347, 257/352, 506, 507; 117/101, 90, 95, 106, 913; 437/111, 126; 148/DIG. 119, 65; 428/428, 432, 426, 457, 469, 620, 630, 627, 642, 212, 215, 216

[56] References Cited

U.S. PATENT DOCUMENTS

| | | | |
|---|---|---|---|
| 3,769,536 | 10/1973 | Antypas et al. | 313/94 |
| 3,902,979 | 9/1975 | Thomas | 204/129.3 |
| 3,959,045 | 5/1976 | Antypas | 156/3 |
| 4,177,321 | 12/1979 | Nishizawa | 428/446 |
| 4,311,743 | 1/1982 | Kasper et al. | 428/64 |
| 4,344,803 | 8/1982 | Kasper | 148/33.3 |
| 4,351,856 | 9/1982 | Matsui | 427/38 |
| 4,683,163 | 7/1987 | Jarry | 428/209 |
| 4,983,251 | 1/1991 | Haisma et al. | 156/628 |
| 5,016,065 | 5/1991 | Seki | 357/16 |
| 5,063,113 | 11/1991 | Wada | 428/446 |
| 5,168,078 | 12/1992 | Reisman et al. | 437/195 |
| 5,168,330 | 12/1992 | Vitkavage | 257/280 |
| 5,173,446 | 12/1992 | Asakawa | 437/111 |
| 5,205,871 | 4/1993 | Godbey | 148/33.3 |
| 5,231,296 | 7/1993 | Rodder | 257/57 |
| 5,294,808 | 3/1994 | Lo | 257/17 |

FOREIGN PATENT DOCUMENTS 432267 2/1992 Japan.

OTHER PUBLICATIONS

J. W. Matthews & A. E. Blakeslee, Defects in Epitaxial Multilayers, J. of Crystal Growth 27 (1974) 118–125.
J. W. Matthews & A. E. Blakeslee, Defects in Epitaxial Multilayers, J. of Crystal Growth 29 (1975) 273–280.
G. H. Olsen & M. Ettenberg, "Crystal Growth Theory and Techniques", C. H. L. Goodman, ed., vol. 2, Plenum Press, New York (1978), Chap. 1, pp. 1–56.

*Primary Examiner*—Ellis P. Robinson
*Assistant Examiner*—Leonidas J. Jones, III
*Attorney, Agent, or Firm*—Stanley Z. Cole; Allan M. Lowe

[57] ABSTRACT

High quality epitaxial layers can be grown on a multi-layer substrate which has a crystalline pseudomorphic layer with an exposed surface used for the epitaxial growth. The pseudomorphic layer of the substrate has a thickness at or below the pseudomorphic limit so it will be deformed as stress forces are developed during epitaxial growth of heteroepitaxial structures. A plastically deformable layer is bonded to the pseudomorphic layer, This plastically deformable layer is made of material that plastically flows at epitaxial growth temperatures.

12 Claims, 3 Drawing Sheets

PSEUDOMORPHIC SUBSTRATES

TECHNICAL FIELD

The present invention relates generally to epitaxial growth of oriented single crystal layers with excellent crystalline properties on unique substrates, and more specifically, to the use of a pseudomorphic substrate consisting of bonded multiple layers including a plastically deformable layer and a single crystal pseudomorphic material layer on which an epitaxially grown oriented single crystal layer can be deposited.

BACKGROUND ART

Epitaxy, the technique of depositing an oriented single crystalline layer on a crystalline substrate, can under certain conditions be used to deposit high quality layers on substrates having different physical properties from those of the epitaxial layer. Though widely and successfully used, epitaxial growth techniques are severely limited by substrate properties. Lattice mismatch between the substrate and the epitaxially grown layers in particular imposes one of the most severe restrictions. The mismatch of concern here is the difference between the substrate and epitaxial material lattice constants. The lattice constants of a crystalline material are the characteristic dimensions of a conventional unit cell determined by the crystal structure and spacing between atoms in the material. For example, a 0.3 percent or greater lattice mismatch between the substrate and epitaxial material will induce stress in the grown layer causing defects in the crystalline structure. Such defects quickly degrade the optical and electronic properties and will accordingly render the devices fabricated from the epitaxially grown layers unusable for optical, optoelectronic or electronic purposes.

Structures having different materials for the epitaxial grown layer and the substrate are referred to as heteroepitaxial structures, while structures which are comprised of the same epitaxial layer and substrate material are known as homoepitaxial structures. Heteroepitaxial structures can be used for many applications which do not have suitable homoepitaxial analogues. However, entire classes of devices that require unique heteroepitaxial structures can not be fabricated because of unacceptably large lattice mismatch in the heteroepitaxial system leading to unacceptable crystal defects. This situation exists in spite of various schemes that have been attempted to circumvent heteroepitaxial lattice mismatch problems. These include the use of superlattices (alternating thin layers of dissimilar materials) or thick strain grading (i.e., lattice-constant grading) layers intended to prevent development of crystal defects in the device active layers. Many applications-specific devices can not be made using these techniques because of an inability to incorporate the required material physical properties in the defect suppression structures.

Substrate physical properties, such as light absorption, and electrical and thermal conductivity, impose additional applications limitations on fabricated devices irrespective of whether they are fabricated using homoepitaxial or heteroepitaxial structures. As an example, optical absorption in substrate materials attenuates the outputs from light emitting diodes and lasers thereby limiting their operating efficiencies. Such light transmission limitations in substrates can also limit efficiencies and pose additional operation limitations for optical detectors, solar cells and other optoelectronic devices.

Many electronic applications for devices fabricated with epitaxially grown layers, particularly solid-state microwave and high-voltage devices, require electrically non-conducting substrates. Materials with large band gaps (the characteristic energy separating the valence and conduction bands in solid-state materials) are needed to meet this substrate requirement. However, substrate materials that have the appropriate lattice constant for the epitaxial system of interest may not have sufficiently large band gaps to be semi-insulating at device operating temperatures. Accordingly such materials can not be used for these applications, thereby, additionally restricting the types of devices that could potentially be made using epitaxial systems.

Another limitation is imposed by the substrate material thermal conductivity. In particular, high-power devices can have maximum power limitations imposed because of the inability to dissipate generated heat. Operation above the maximum power limits will excessively increase the device temperatures and accordingly decrease device performance and lifetime. Since device heat-sinking capabilities are usually controlled primarily by the thermal conductivity of the substrate, the maximum power at which devices can be operated is limited by the substrate used to support epitaxial growth.

While lattice mismatch in heteroepitaxial systems leads to defect generation in relatively thick epitaxially grown layers, thin strained epitaxial layers can be grown without crystal defects even when grown on grossly lattice mismatched substrates. Avoidance of crystal defects is achieved by imposing a thickness limitation on the epitaxial layers. By limiting the epitaxial layer thickness, the resulting stress due to the lattice mismatch is accommodated elastically through distortion of the epitaxial layer lattice constant. Such thin epitaxial layers which exhibit lattice constant adjustment through crystal lattice deformation are referred to as pseudomorphic layers. Crystal defects begin to occur in such layers as their thicknesses increase to the point where the total elastic strain energy exceeds the energy required for defect formation. Initiation of crystal defect formation effectively defines the maximum pseudomorphic layer thickness known as the pseudomorphic limit. This pseudomorphic limit is dependent upon the material properties of the epitaxial grown layer and the lattice mismatch between this material and the substrate. Depending upon the application many devices can not be made from pseudomorphic layers because the thicknesses as restricted by the pseudomorphic limit are too small.

DISCLOSURE OF THE INVENTION

The invention provides unique substrates on which thick layers of various materials can be epitaxially grown yielding high-quality layers without defects. Substrates provided by this invention overcome prior limitations imposed by lattice mismatch, optical absorption, electrical isolation, thermal conductivity and other material physical characteristic limitations. In its simplest form, the pseudomorphic substrate of this invention is assembled from two layers: a single crystal pseudomorphic material layer and a plastically deformable layer that can accommodate deformation of the pseudomorphic material layer at the epitaxial growth temperature. The plastically deformable layer is a material that plastically flows at the epitaxial growth temperature, such as glass. To form a pseudomorphic substrate a plastically deformable layer is bonded to a pseudomorphic material layer. After bonding the pseudomorphic substrate is mounted in an epitaxial deposition system so that at least one epitaxial layer can be grown on the exposed pseudomorphic material layer surface. At the onset of epitaxial growth the epitaxial layer if strained is pseudomorphically deformed. As the thickness of the epitaxial layer increases, the stresses induced by lattice mismatch cause the pseudomorphic material layer of the substrate to deform so that its lattice constant conforms to that of the epitaxially deposited material. Such deformation of the pseudomorphic material layer, which has a thickness less than the pseudomorphic limit relative to the epitaxial layer being grown, causes the plastically deformable layer to flow and accommodate changes in the pseudomorphic material layer lattice constant through variance of the lateral dimensions. For epitaxial layer thicknesses significantly greater than the pseudomorphic limit of the heteroepitaxial system, the lattice constant of the epitaxial layer will assume its bulk value. Thus high quality epitaxial layers of oriented single crystals without defects can be grown on substrates provided by this invention. This allows for epitaxial growth using materials and structures whose characteristics are properly tailored for many applications without restrictive limitations imposed by lattice matching requirements. An alternative embodiment of a substrate for this invention includes a mechanical support layer bonded to the plastically deformable layer on the surface opposite the pseudomorphic material layer. This alternative embodiment of the invention provides latitude in selecting the properties of the mechanical support layer which is not a crystal capable of supporting epitaxial growth.

BRIEF DESCRIPTION OF THE DRAWINGS

The various objectives, advantages, and novel features of the present invention will become more readily apprehended from the following detailed description when taken in conjunction with the appended drawings, in which.

BEST MODE FOR CARRYING OUT THE INVENTION

Figure 1A:
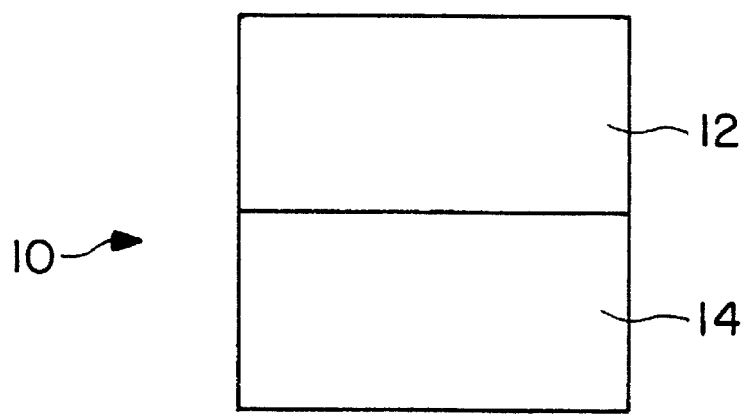
FIGS. 1a and 1b are schematic diagrams showing a structure for the pseudomorphic substrate of the invention without and with an epitaxially grown layer respectively.

Referring now to the drawings, wherein corresponding components are designated by the same reference numbers throughout the various figures, a schematic diagram is shown in FIG. 1a of a first embodiment of a pseudomorphic substrate according to the invention where it is generally designated by reference number 10. This pseudomorphic substrate 10 is constructed by bonding a pseudomorphic material layer 12 on a plastically deformable layer 14.

The pseudomorphic material layer 12 is a single crystal layer that is chosen to provide both: (i) a crystal structure from which an epitaxial layer 16 (see, FIG. 1b) can be grown; and, (ii) proper bulk material characteristics required for final device operation. In order to obtain the optimum bulk material characteristics in pseudomorphic material layer 12, it may become necessary to use a pseudomorphic material layer 12 having a lattice constant that is appreciably mismatched from that of the epitaxial layer 16 to be grown. As previously discussed a 0.3 percent or greater lattice mismatch between a crystal substrate and a grown epitaxial layer 16 could, without the pseudomorphic substrate 10 of this invention, cause crystal defects in the epitaxial layer 16. When the epitaxial layer 16 is initially deposited on the pseudomorphic substrate 10 the crystal lattice of layer 16 deforms elastically without defects because layer 16 is initially quite thin. Initially the lattice constant of the thin epitaxial layer 16 conforms to the lattice constant of the pseudomorphic material layer 12. Continued growth of an epitaxial layer 16 on the pseudomorphic material layer 12 causes the stress forces to elastically deform the pseudomorphic material layer 12 while the epitaxial layer 16 assumes its bulk lattice constant. Without more capability to accommodate stress forces, continued growth of the epitaxial layer 16 would result in crystal defect formation. However, according to the invention the material for the plastically deformable layer 14 is chosen so that it plastically flows at the epitaxial growth temperature and the imposed deformation of the pseudomorphic material layer 16 can be accommodated without causing crystal defects.

In conventional heteroepitaxy a thick single crystal substrate is used and the epitaxial layer 16 develops crystal defects as growth continues if the lattice mismatch strain cannot be accommodated. This limits the thickness of the epitaxial layer to less than the pseudomorphic limit, which is the thickness at which strain cannot be accommodated elastically and crystal defects start to develop. The invention in part addresses this situation by having the pseudomorphic material layer 12 (which serves as the single crystal growth substrate) thickness be less than the pseudomorphic limit as determined from the heteroepitaxial lattice mismatch and the physical properties of the materials selected for the pseudomorphic material layer 12 and the epitaxial layer 16, see J. W. Matthews & A. E. Blakeslee, J. Crystal Growth 27, 118 (1974). As discussed in the Matthews et al. article the thickness corresponding to the pseudomorphic limit for a layer such as a pseudomorphic material layer 12 can be calculated using the following formula, when solved by iteration.

$$h_c = \frac{b}{2\pi f} \frac{(1-\nu\cos^2\alpha)}{(1+\nu)\cos\lambda} \left( \ln\frac{h_c}{b} + 1 \right)$$

where:

$h_1$ is the thickness for the pseudomorphic limit in the Angstroms (Å);

b is the strength of the dislocations;

f is twice the maximum value of strain;

$\nu$ is the Poisson ratio;

$\alpha$ is the angle between the dislocation line and its Burgers vector; and $\lambda$ is the angle between the slip direction and that direction in the film plane which is perpendicular to the line intersection of the slip plane and the interface.

In the article use of this formula is discussed with respect to a GaAs-Ga As$_{0.5}$P$_{0.5}$ crystalline structure. There, the calculated pseudomorphic limit is approximately 250Å, with $\nu$=⅓, b=4Å, cos $\alpha$=½, cos $\lambda$=½ and f=0.018. Also discussed in the article is diffusion after layer growth which brings the range for pseudomorphic limit from 250Å to roughly 350Å. Accordingly the thickness corresponding to pseudomorphic limit for pseudomorphic material layer 12 can be determined using known calculations such as those discussed in the Matthews et al. article. Further values for pseudomorphic limit for pseudomorphic material layers 12 are identified in the examples described below.

If the thickness of the pseudomorphic material layer 12 is greater than the pseudomorphic limit, crystal defects develop because the elastic deformation of the pseudomorphic material layer 12 is insufficient to adequately reduce the generated stress forces during the growth of the epitaxial layer 16. In the case of homoepitaxy, there is no maximum thickness for the pseudomorphic material layer 12 due to the absence of lattice mismatch. The invention, however, is not limited to homoepitaxial or heteroepitaxial structures because it is usable with both types of structures.

This invention provides superior stress relief capabilities in the pseudomorphic substrate 10 through the combination of a pseudomorphic material layer 12 and a plastically deformable layer 14 which flows to reduce the stress forces in the pseudomorphic material layer 12. In construction, the pseudomorphic substrate 10 is assembled by bonding a pseudomorphic material layer 12 to a plastically deformable layer 14. To be effective, the plastically deformable layer 14 not only must provide bulk material characteristics, such as optical and electrical properties, necessary for applications in which the pseudomorphic substrate 10 is going to be used, but must in addition be plastically deformable at temperatures in the range of those used for epitaxial growth. Depending on the application, glasses of various types, such as Corning 7056 glass and Schott 283 glass, and also glasses used in manufacture of photocathodes can be used for plastically deformable layer 14. Relevant physical information concerning these glasses appears below in Table 1.

TABLE I

|  | Corning Glass No. 7056 | Schott Glass No. 283 |
| --- | --- | --- |
| Coefficient of Expansion | $51.5 \times 10^{-7}/°C$ | $62 \times 10^{-7}/°C$ |
| Stress Temperature | 472° C. |  |
| Annealing Temperature | 512° C. | 581° C. |
| Softening Temperature | 520° C. | 705° C. |

Materials used for the plastically deformable layer 14 are not restricted to glass as long as the material exhibits the necessary bulk characteristics and is plastically deformable at epitaxial growth temperatures. Examples of usable non-glass materials include metals such as indium tin oxide (ITO) and aluminum. Glass though is a superior plastically deformable layer 14 material for those applications requiring an optically transparent or high-resistivity substrate.

Bonding of pseudomorphic material layers 12 to plastically deformable layers 14 can be accomplished using heat bonding as described in both U.S. Pat. No. 3,769,536 issued Oct. 30, 1973 and U.S. Pat. No. 3,959,045 issued May 25, 1976. Photocathodes and processes for making photocathodes are described in these patents where crystalline active layers with and without passivating layers are heat bonded to glass layers. Both epitaxial growth temperatures and stress forces induced by epitaxially grown layers can be tolerated by such heat bonds.

The thickness of plastically deformable layer 14 in the invention 10 must be sufficient to structurally withstand the stress forces induced by the epitaxial growth on the pseudomorphic material layer 12. Therefore, the minimum thickness for the plastically deformable layer 14 is determined by the maximum allowable distortion for pseudomorphic substrate 10. This mechanical situation exists because the pseudomorphic material layer 12, in most cases, provides minimal gross structural stiffness. For most applications plastically deformable layer 14 thicknesses, using glass, of 0.002 to 0.030 inches are appropriate.

The material chosen for the plastically deformable layer 14 should have a coefficient of thermal expansion which nearly matches the coefficient of thermal expansion of the pseudomorphic material layer 12 over the temperature range of room temperature to the annealing point of the plastically deformable layer 14. The annealing point is defined as the temperature at which the material viscosity equals $10^{13}$ poises. For temperatures lower than the annealing point, the plastically deformable layer 14 may not sufficiently flow to accommodate the stress forces produced by differences in the thermal expansions between layers. Therefore, in this reduced temperature range, crystal defects will result in the pseudomorphic material layer 12 unless the thermal expansion of this layer is nearly matched to that of the plastically deformable layer 14. Acceptable mismatching of coefficients of thermal expansion can be within five percent.

Acceptable heat bonding processes for this invention involve bringing plastically deformable layers 14 in contact with the pseudomorphic material layers 12 and applying a moderate pressure, e.g., about 10 g/cm$^2$. The temperature of this contacted structure is then raised to the strain point of the plastically deformable layer 14. The strain point of a material is determined from the thermal expansion of the material as the temperature at which the thermal expansion begins departing markedly from a linear relationship with temperature. This temperature is the lower boundary of the annealing range. The time required to complete the heat bonding is dependent upon the plastically deformable layer 14 strain temperature, the temperature used for heat bonding, the magnitude of the applied force, and other details of the bonding process as are known.

To significantly improve the thermal conductivity of the pseudomorphic substrate 10 and maximize the conduction of heat from the epitaxial layers 16 used in operating devices the thickness of the plastically deformable layer 14 can be decreased. This design approach provides immediate thermal conductivity improvement but unavoidably decreases the mechanical strength of the pseudomorphic substrate 10. The invention can address this consequence by incorporating a mechanical support layer 18 (see, FIG. 2) in an alternative embodiment of the pseudomorphic substrate of this invention generally designated by the reference number 20. The pseudomorphic substrate 20 can be used not only for applications requiring superior thermal conductivity but also for other applications requiring additional mechanical support. Since thermal conductivity can be an essential requirement for the pseudomorphic substrate 20, the mechanical support layer 18 needs, for such applications, to be selected from materials having large thermal conductivities such as sapphire, alumina, or diamond. As with the pseudomorphic material layer 12, the mechanical support layer 18 can be thermally bonded to the plastically deformable layer 14. Because the mechanical support layer 18 is not directly bonded to the pseudomorphic material layer 12, it is not necessary to have a rigorous match in the thermal expansions of these two materials. Using a mechanical support layer with a different thermal expansion, however, can cause the pseudomorphic substrate 20 to structurally distort in a bow shape. The amount of distortion can be calculated from the thermal expansion coefficients, Young's moduli, and thicknesses of the respective layers in the pseudomorphic substrate 20 using the analysis outlined in G. H. Olsen and M. Ettenberg, "Crystal Growth Theory and Techniques," Vol. 2, Plenum Press, N.Y. (1978), Chap. 1, pp. 1–56.

Differences in the thermal expansion between the mechanical support layer 18 and the other layers of the pseudomorphic substrate 20 are determinative of the minimum thickness of the plastically deformable layer 14 in the pseudomorphic substrate 20. This minimum thickness of the plastically deformable layer 14 is determined from the stresses generated at the interfaces of the plastically deformable layer 14—mechanical support layer 18, and at the plastically deformable layer 14—pseudomorphic material layer 12 so that they are less than the critical stress for the plastically deformable layer 14 that would cause cracking. The same analysis used for calculating bowing of the pseudomorphic substrate 20, referenced above, can be used to calculate the stresses generated in the plastically deformable layer 14 by thermal expansion mismatches in pseudomorphic substrate 20.

Figure 1B:
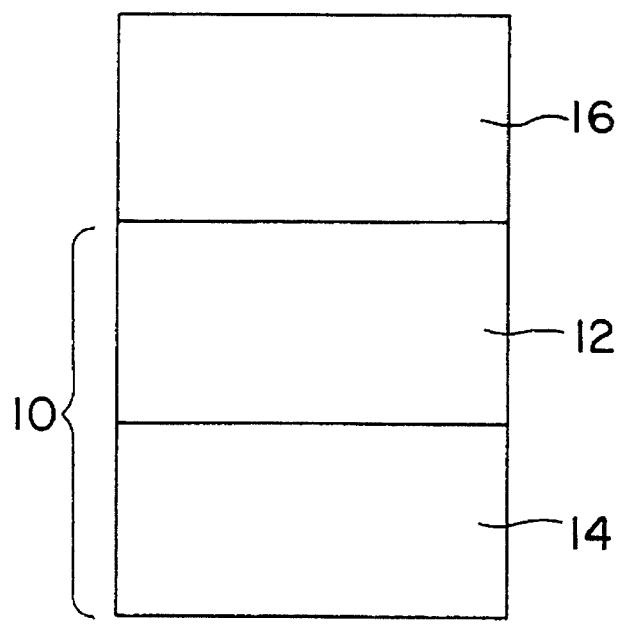
Figure 2:
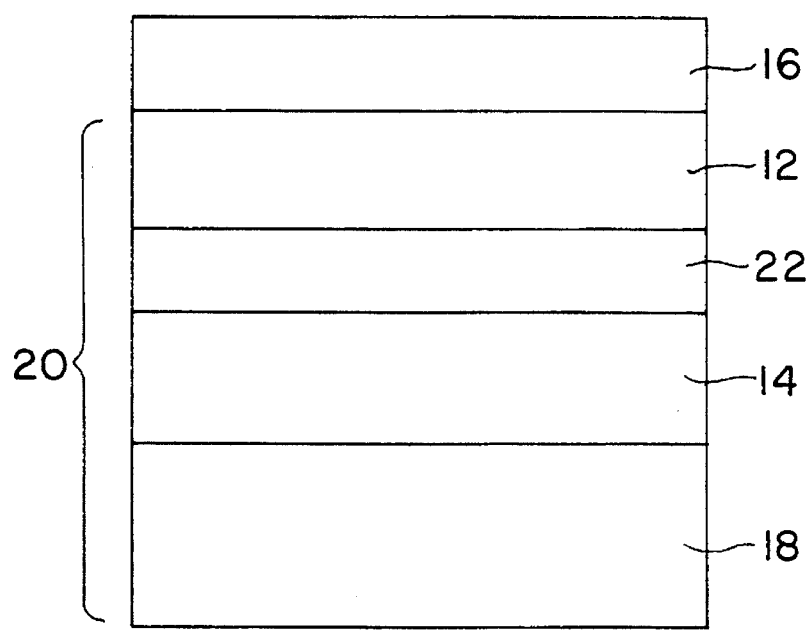
FIG. 2 is a schematic diagram showing a structure for an alternative embodiment of a pseudomorphic substrate according to the invention with an epitaxially grown layer.

The pseudomorphic substrate 10 shown in FIGS. 1a and 1b or the pseudomorphic substrate 20 shown in FIG. 2 can also include an encapsulating layer 22. An encapsulating layer 22 is only shown in FIG. 2, but one can be similarly used as part of the pseudomorphic substrate 10. The encapsulating layer 22 can serve three purposes: (i) protection of the pseudomorphic material layer 12 during high temperature bonding; (ii) facilitating the bonding of the pseudomorphic material layer 12 to the plastically deformable layer 14; and (iii) reducing light reflections from the interface between the plastically deformable layer 14 and the pseudomorphic material layer 12. As discussed below the encapsulating layer 22 can be fabricated using standard materials and processes for achieving the intended purposes.

Figure 3:
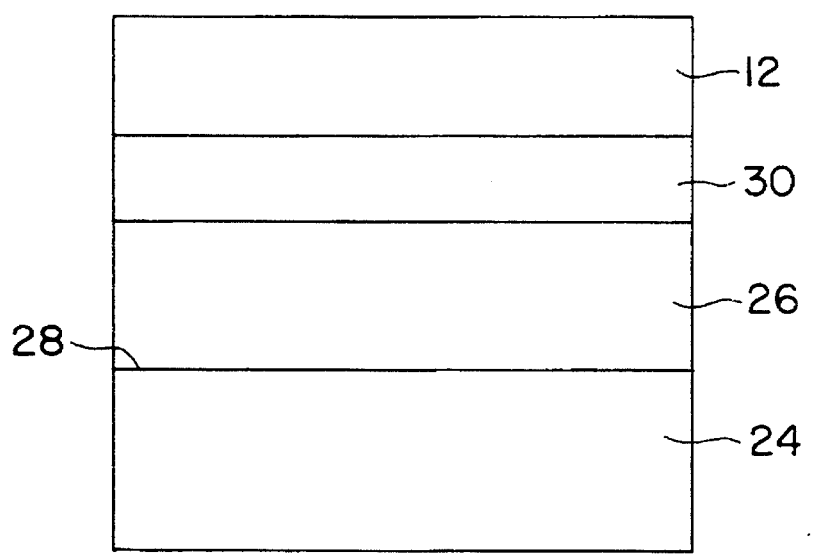
FIG. 3 is a schematic diagram showing a multilayer structure usable for fabricating pseudomorphic material layers needed for the invention; and, FIG. 4 is a flow diagram illustrating steps for manufacturing pseudomorphic substrates shown in FIGS. 1a, 1b, and 2.

A first step that can be used for fabricating a pseudomorphic substrate 10 or a pseudomorphic substrate 20 is the epitaxial growth on a conventional substrate 24 (see, FIG. 3) of a structure incorporating a pseudomorphic material layer 12. This epitaxial growth process can begin with homoepitaxial growth of a buffer layer 26 on substrate 24. Growth of this buffer layer 26 substantially reduces defects and the surface contaminants in the pseudomorphic material layer 12. Buffer layer thickness typically range from a few tenths of microns to a few microns. Next an etch-stop layer 30 is heteroepitaxially grown. The etchstop 30 serves to prevent the echant used to remove the substrate 24 from attacking the pseudomorphic material layer 12 during fabrication of the pseudomorphic substrate 10 or the pseudomorphic substrate 20. Thicknesses required for the etch-stop layer 30 range from a few hundred Angstroms to more than a micron. The pseudomorphic material layer 12 is then grown. After growth of the epitaxial structure shown in FIG. 3, depending on what applications the pseudomorphic material layer 12 is going to be used for, an encapsulating layer 22 can be deposited on top of the pseudomorphic material layer 12 using known techniques for the deposition of dielectrics. The thickness and compositions of the encapsulating layer 22 are determined by its function, e.g., to give minimum optical reflectance at a particular wavelength or as a protective layer for the pseudomorphic material layer 12.

The grown pseudomorphic material layer 12, with or without the encapsulating layer 22, is now bonded to a plastically deformable layer 14. If a mechanical support layer 18 is to be used it also can now be bonded to the plastically deformable layer 14 either prior to, simultaneously with or subsequent to the bonding of the pseudomorphic material layer 12. If the choice of materials for the mechanical support layer 18 and the plastically deformable layer 14 allow a sufficiently thin plastically deformable layer 14, then the plastically deformable layer 14 can be deposited directly on the mechanical support layer 18 or on the pseudomorphic material layer 12 using known chemical or physical deposition techniques, e.g., sputtering, evaporation, etc. After bonding of the pseudomorphic material layer 12 to the plastically deformable layer 14 and the mechanical support layer 18, if any, the substrate 24 and buffer layer 26 are removed using known selective wet chemical or dry etching techniques. The etch-stop layer 30 is left on the pseudomorphic material layer 12 to protect it from physical damage, degradation, or contamination due to air exposure. The etch-stop layer 30 is removed immediately prior to use in an epitaxial deposition system by selective wet chemical or dry etching techniques.

Figure 4:
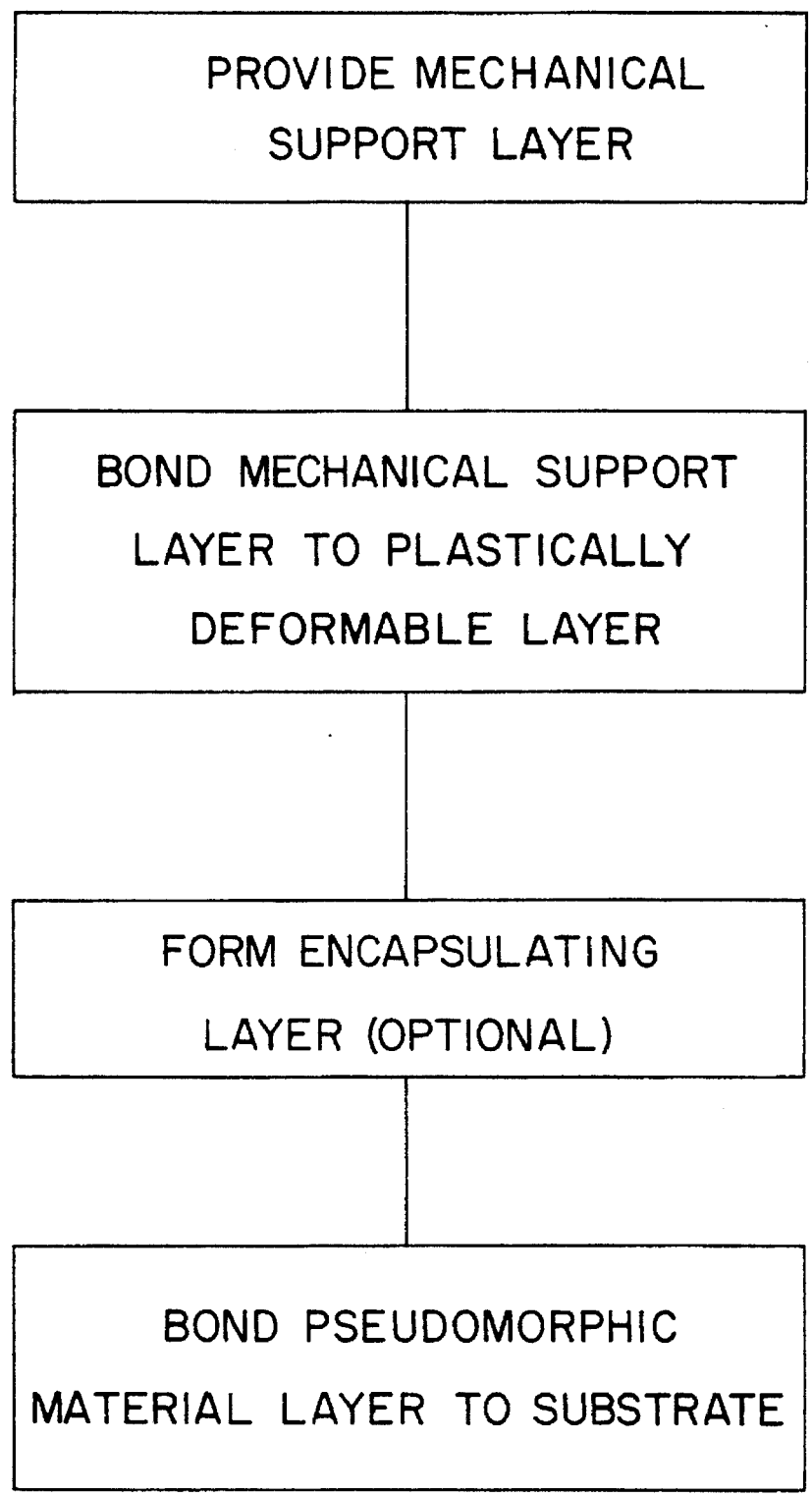

FIG. 4 shows a flow diagram illustrating the steps for the fabrication of a pseudomorphic substrate 20 as illustrated in FIG. 2. Elimination of the steps for providing a mechanical support layer 18 and the optional encapsulating layer 22 from the flow diagram set out in FIG. 4 yields the process steps for the fabrication of a pseudomorphic substrate 10.

Listed below are material identifications and thickness specifications for one example of a pseudomorphic substrate 10 and two examples of pseudomorphic substrates 20 according to the invention.

EXAMPLE I (Pseudomorphic Substrate 10)

In this example, the plastically deformable layer 14 provides necessary support. This plastically deformable layer 14 is a 0.040 inch thick piece of Corning 7056 glass. The pseudomorphic material layer is a 250 Å thick GaAs layer on which is deposited a encapsulating layer 22 of $Si_3N_4$ that is on the order of 1000 Å thick.

EXAMPLE II (Pseudomorphic Substrate 20)

In this example a mechanical support layer 18 provides the necessary mechanical support. The pseudomorphic material layer 12 is a 200 Å thick layer of $In_{0.30}Ga_{0.70}P$ with an 800 Å thick $SiO_2$ encapsulating layer 22. This pseudomorphic material layer 12 is epitaxially grown on a GaAs substrate 24 according to the process described in FIG. 3 and is lattice mismatched to the substrate. The plastically deformable layer 14 is a 0.016-inch thick layer of Corning 7056 glass and the mechanical substrate layer 18 is a 0.025-inch thick layer of GaAs.

EXAMPLE III (Pseudomorphic Substrate 20)

A thin plastically deformable layer 14 and a high thermal conductivity material mechanical support layer are described in this example. The pseudomorphic material layer 12 is a 150 Å thick layer of $In_{0.49}Ga_{0.51}P$ with a 300 Å thick $Si_3N_4$ encapsulating layer 22. Again, as in Example II, this pseudomorphic material layer 12 is epitaxially grown on a GaAs substrate 24 according to the process described in FIG. 3. The high thermal conductivity structure used to support the pseudomorphic material layer 12 includes a 0.008-inch thick piece of Schott 283 glass as the plastically deformable layer 14 and a 0.040 inch thick sapphire mechanical support layer 18.

The above discussion and related illustrations of the present invention are directed primarily to preferred embodiments and practices of the invention. However, it is believed that numerous changes and modifications in the actual implementation of the described concepts will be apparent to those skilled in the art, and it is contemplated that such changes and modifications may be made without departing from the scope of the invention as defined by the following claims.

What is claimed is:

1. An article comprising:

a substrate; and an epitaxial layer grown on the substrate;

said substrate including:

(a) a crystalline pseudomorphic material layer having a thickness no greater than a pseudomorphic limit for said crystalline pseudomorphic material layer and said epitaxial layer, the crystalline pseudomorphic material layer and the epitaxial layer having differing lattice constants to provide a tendency for a deformation to be imposed on the epitaxial layer;

(b) a plastically deformable layer having a thickness sufficient to structurally withstand stress forces induced by the epitaxial layer on the pseudomorphic layer bonded to the crystalline layer prior to the epitaxial layer being grown on the crystalline pseudomorphic material layer so the crystalline layer is between the plastically deformable layer and the epitaxial layer, the plastically deformable layer being a material that plastically flows at the epitaxial layer growth temperature and having a coefficient of thermal expansion approximately equal to the coefficient of thermal expansion of the pseudomorphic material layer over a temperature range of approximately room temperature to the annealing temperature of the plastically deformable layer, the layers being such that the tendency for the epitaxial layer to be deformed is overcome without causing substantial crystal defects in the epitaxial layer.

2. The article of claim 1, wherein said plastically deformable layer is glass.

3. The article of claim 1, wherein said plastically deformable layer is metal.

4. The article of claim 1, wherein said pseudomorphic material layer is a first material and said plastically deformable layer is a second material, said first and second materials having coefficients of thermal expansion that are within five percent of each other.

5. The article of claim 1, further including a mechanical support layer bonded to said plastically deformable layer.

6. The article of claim 1, wherein the plastically deformable layer is glass, and further including an encapsulating layer comprising a protective layer for preventing the loss of volatile constituents during a bonding process of the glass deformable layer to said pseudomorphic substrate, the encapsulating layer being located between said pseudomorphic material layer and said plastically deformable layer.

7. The article of claim 6 wherein the encapsulating layer is sandwiched between said pseudomorphic material layer and said plastically deformable layer.

8. The article of claim 1 wherein the epitaxial layer is a heteroepitaxial growth.

9. The article of claim 1 wherein the plastically deformable layer is about a 0.040 inch thick glass layer having a coefficient of expansion of about $51.5 \times 10^{-7}/°C$. and an annealing temperature of about 512° C., the pseudomorphic material layer is an about 250 Å thick GaAs layer, and an about 1000 Å thick $Si_3N_4$ encapsulating layer being deposited on the pseudomorphic material layer and bonded to the plastically deformable layer.

10. The article of claim 1 wherein said substrate includes an about 0.025 inch thick GaAs mechanical support layer bonded to an about 0.016 inch thick layer having a coefficient of thermal expansion of about $51.5 \times 10^{-7}/°C$. and an annealing temperature of about 512° C. forming the glass plastically deformable layer, an about 800 Å thick $SiO_2$ encapsulating layer bonded to the deformable layer and deposited on the pseudomorphic layer, the pseudomorphic layer being an about 200 Å thick $In_{0.30}Ga_{0.70}P$ layer.

11. The article of claim 1 wherein the substrate includes an about 0.040 inch thick sapphire mechanical support layer, the plastically deformable layer being an about 0.008 inch thick glass layer having an annealing temperature of about 581° C. and a coefficient of thermal expansion of about $62 \times 10^{-7}/°C$. bonded to the about 0.040 inch thick sapphire mechanical support layer, the pseudomorphic material layer being an about 150 Å thick $In_{0.49}Ga_{0.51}P$ layer on which is deposited an about 300 Å thick $Si_3N_4$ encapsulating layer bonded to the deformable layer.

12. A substrate with an exposed surface from which an epitaxial layer can be grown, said substrate including the combination of an about 0.040 inch thick sapphire mechanical support layer bonded to an about 0.008 inch thick glass plastically deformable layer characterized by an annealing temperature of about 581° C. and a coefficient of expansion of about $62 \times 10^{-7}/°C$. bonded to an about 300 Å thick $Si_3N_4$ encapsulating layer deposited on an about 150 Å thick $In_{0.49}Ga_{0.51}P$ pseudomorphic material layer.

* * * * *